US010388394B2

(12) United States Patent
Tate et al.

(10) Patent No.: US 10,388,394 B2
(45) Date of Patent: Aug. 20, 2019

(54) SYNDROME WEIGHT BASED EVALUATION OF MEMORY CELLS PERFORMANCE USING MULTIPLE SENSE OPERATIONS

(71) Applicant: Apple Inc., Cupertino, CA (US)

(72) Inventors: Yonathan Tate, Kfar Saba (IL); Tomer Ish-Shalom, Ra'anana (IL)

(73) Assignee: APPLE INC., Cupertino, CA (US)

( * ) Notice: Subject to any disclaimer, the term of this patent is extended or adjusted under 35 U.S.C. 154(b) by 177 days.

(21) Appl. No.: 15/658,430

(22) Filed: Jul. 25, 2017

(65) Prior Publication Data

US 2019/0035485 A1 Jan. 31, 2019

(51) Int. Cl.

*G11C 29/00* (2006.01)
*G11C 29/42* (2006.01)
*G06F 11/10* (2006.01)
*G11C 29/44* (2006.01)

(52) U.S. Cl.

CPC .......... *G11C 29/42* (2013.01); *G06F 11/1012* (2013.01); *G06F 11/1076* (2013.01); *G11C 29/44* (2013.01)

(58) Field of Classification Search

None

See application file for complete search history.

(56) References Cited

U.S. PATENT DOCUMENTS 8,000,135 B1 8/2011 Perlmutter et al.
8,156,398 B2 4/2012 Sommer et al.
8,259,506 B1 9/2012 Sommer et al.
8,305,811 B2 11/2012 Jeon
8,369,141 B2 2/2013 Sommer et al.
8,694,854 B1 4/2014 Dar et al.
8,773,904 B2 7/2014 Anholt et al.
8,830,746 B2 9/2014 Barkon et al.

(Continued)

FOREIGN PATENT DOCUMENTS

JP 2011100519 A 5/2011
JP 2011165301 A 8/2011

OTHER PUBLICATIONS

Kim et al., "Future Memory Technology including Emerging New Memories", Proceedings of the 24th International Conference on Microelectronics (MIEL), vol. 1, pp. 377-384, May 16-19, 2004.

(Continued)

*Primary Examiner* — Daniel F. McMahon
(74) *Attorney, Agent, or Firm* — Kligler & Associates

(57) ABSTRACT

A memory system includes an interface and storage circuitry. The interface is configured to communicate with a plurality of memory cells that store data by setting the memory cells to analog voltages representative of respective storage values. The storage circuitry is configured to read from a group of the memory cells a code word encoded using an Error Correction Code (ECC), by sensing the memory cells using at least first and second read thresholds for producing respective first and second readouts, to calculate, based on at least one of the first and second readouts, (i) a syndrome weight that is indicative of an actual number of errors contained in the code word, and (ii) a mid-zone count of the memory cells for which the first readout differs from the second readout, and, to evaluate a performance measure for the memory cells, based on the calculated syndrome weight and mid-zone count.

16 Claims, 3 Drawing Sheets

(56) References Cited

U.S. PATENT DOCUMENTS

| | | | | |
|---|---|---|---|---|
| 8,850,292 | B2 | 9/2014 | Lee | |
| 8,869,008 | B2 | 10/2014 | Baum et al. | |
| 8,885,409 | B2 * | 11/2014 | Lee | G11C 16/0483 365/185.1 |
| 9,009,390 | B2 | 4/2015 | Choi et al. | |
| 9,009,576 | B1 | 4/2015 | Jeon et al. | |
| 9,135,972 | B2 * | 9/2015 | Dar | G11C 11/00 |
| 9,136,875 | B2 | 9/2015 | Yen et al. | |
| 9,176,815 | B2 | 11/2015 | Chen et al. | |
| 9,431,130 | B2 | 8/2016 | Sakurada | |
| 9,563,502 | B1 | 2/2017 | Alhussien et al. | |
| 9,583,217 | B2 | 2/2017 | Lin et al. | |
| 9,697,075 | B2 | 7/2017 | Tate et al. | |
| 9,779,818 | B2 | 10/2017 | Baum et al. | |
| 10,199,111 | B1 * | 2/2019 | Besinga | G11C 16/28 |
| 2007/0297245 | A1 | 12/2007 | Mokhlesi | |
| 2009/0059698 | A1 | 3/2009 | Chang et al. | |
| 2011/0161775 | A1 | 6/2011 | Weingarten | |
| 2012/0008401 | A1 | 1/2012 | Katz et al. | |
| 2012/0221917 | A1 | 8/2012 | Bueb et al. | |
| 2013/0070524 | A1 * | 3/2013 | Dutta | G11C 11/5642 365/185.03 |
| 2013/0170272 | A1 * | 7/2013 | Anholt | G11C 11/5642 365/45 |
| 2014/0331106 | A1 * | 11/2014 | Baum | G06F 11/10 714/766 |

OTHER PUBLICATIONS

Bez et al., "Introduction to Flash Memory", Proceedings of the IEEE, vol. 91, No. 4, pp. 489-502, Apr. 2003.

Eitan et al., "Multilevel Flash Cells and their Trade-Offs", Proceedings of the IEEE International Electron Devices Meeting (IEDM), pp. 169-172, Dec. 8-11, 1996.

Eitan et al.,"Can NROM, a 2-bit, Trapping Storage NVM Cell, Give a Real Challenge to Floating Gate Cells?" Proceedings of the 1999 International Conference on Solid State Devices and Materials (SSDM), pp. 522-524, Sep. 21-24, 1999.

Maayan et al., "A 512 Mb NROM Flash Data Storage Memory with 8 MB/s Data Rate", Proceedings of the IEEE International Solid-State Circuits Conference, pp. 100-101, Feb. 3-7, 2002.

* cited by examiner

SYNDROME WEIGHT BASED EVALUATION OF MEMORY CELLS PERFORMANCE USING MULTIPLE SENSE OPERATIONS

TECHNICAL FIELD

Embodiments described herein relate generally to data storage, and particularly to methods and systems for syndrome-weight based estimation of the readout performance of memory cells that are sampled using multiple read thresholds.

BACKGROUND

The performance of non-volatile memory cells typically degrades over the device's lifetime due to various impairments. As a result, storage reliability of the memory cells may degrade below an acceptable level.

Methods for estimating the performance of non-volatile memory cells are known in the art. For example, U.S. Pat. No. 9,431,130 describes a memory controller that includes a decoding unit. The decoding unit calculates a syndrome weight in an LDPC code using a code word read out from a non-volatile memory. The memory controller instructs the non-volatile memory to perform readout using first and second read-out voltages, and determines the first read-out voltage as the optimal read-out voltage in the case where a first syndrome weight based on a read-out result at the first read-out voltage is equal to or less than a second syndrome weight based on a read-out result at the second read-out voltage.

U.S. Pat. No. 9,563,502 describes methods and apparatus for read retry operations with read reference voltages ranked for different page populations of a memory. One method comprises obtaining a plurality of rankings of a plurality of read reference voltages for a plurality of page populations, wherein the rankings are based on a predefined performance metric; and reading a code word from the memory a plurality of times, wherein each of the read operations uses a different one of the plurality of read reference voltages selected based on the rankings. The performance metric comprises, for example, a bit error rate, a bit polarity disparity, a substantially minimal syndrome weight and/or measures of an average system latency or a tail latency.

SUMMARY

An embodiment that is described herein provides a memory system that includes an interface and storage circuitry that includes a processor. The interface is configured to communicate with a plurality of memory cells that store data by setting the memory cells to analog voltages representative of respective storage values. The storage circuitry is configured to read from a group of the memory cells a code word encoded using an Error Correction Code (ECC), by sensing the memory cells using at least first and second read thresholds for producing respective first and second readouts, the processor is configured to determine, based on at least one of the first and second readouts, (i) a syndrome weight that is indicative of an actual number of errors contained in the code word, and (ii) a mid-zone count of the memory cells for which the first readout differs from the second readout, and, the processor is further configured to evaluate a performance measure for the memory cells, based on the determined syndrome weight and mid-zone count.

In some embodiments, the storage circuitry processor is configured to determine the syndrome weight based only on one of the first readout and the second readout. In other embodiments, the storage circuitry processor is configured to assign respective soft metric values to elements of the first readout, based on the first readout and on the second readout, each soft metric value includes a sign and a magnitude, and to determine the syndrome weight based on signs of the soft metrics that were assigned to the elements of the first readout. In yet other embodiments, the storage circuitry processor is configured to produce a syndrome vector by multiplying the first readout by a parity-check matrix representing the ECC, and to calculate the syndrome weight by counting a number of nonzero elements in the syndrome vector.

In an embodiment, the storage circuitry processor is configured to evaluate the performance measure by estimating a channel matrix that is indicative of a readout performance of the memory cells in the group. In another embodiment, the syndrome weight is a function of a linear combination of the mid-zone count and a conditional probability of the channel matrix, and the storage circuitry processor is configured to estimate the channel matrix by estimating the conditional probability based on the function and on the calculated syndrome weight and mid-zone count.

In some embodiments, the storage circuitry is configured to select between hard and soft ECC decoding, based on the evaluated performance measure. In other embodiments, the storage circuitry is configured to determine a number of read thresholds to use in subsequent read operations based on the evaluated performance measure. In yet other embodiments, the memory cells in the group are configured to store multiple bits per cell, in a set of multiple programming levels predefined within a range of threshold voltages, and the storage circuitry is configured to sense the memory cells using multiple read thresholds, including the first and second read thresholds, and produce multiple respective readouts, including the first and second readouts, the multiple read thresholds divide the range of threshold voltages into multiple zones, to identify among the multiple zones two or more middle zones corresponding to mid-ranges between respective programming levels, to calculate, by the storage circuitry processor, a syndrome weight based on one of the multiple readouts, and, to evaluate, by the storage circuitry processor, the performance measure based on the calculated syndrome weight, and on a number of memory cells for which the readouts fall in the middle zones.

There is additionally provided, in accordance with an embodiment that is described herein, a method, including, in a memory system that includes a plurality of memory cells that store data by setting the memory cells to analog voltages representative of respective storage values, reading from a group of the memory cells a code word that was encoded using an Error Correction Code (ECC), by sensing the memory cells in the group using at least first and second read thresholds for producing respective first and second readouts. Based on at least one of the first readout and the second readout, a syndrome weight and a mid-zone count are calculated, by a processor of the memory system, for the code word so that (i) the syndrome weight estimates an actual number of errors contained in the code word, and (ii) the mid-zone count estimates the memory cells for which the first readout differs from the second readout. A performance measure is evaluated, by the processor, for the memory cells in the group, based on the calculated syndrome weight and mid-zone count.

These and other embodiments will be more fully understood from the following detailed description of the embodiments thereof, taken together with the drawings in which:

DETAILED DESCRIPTION OF EMBODIMENTS

Overview

Figure 1:
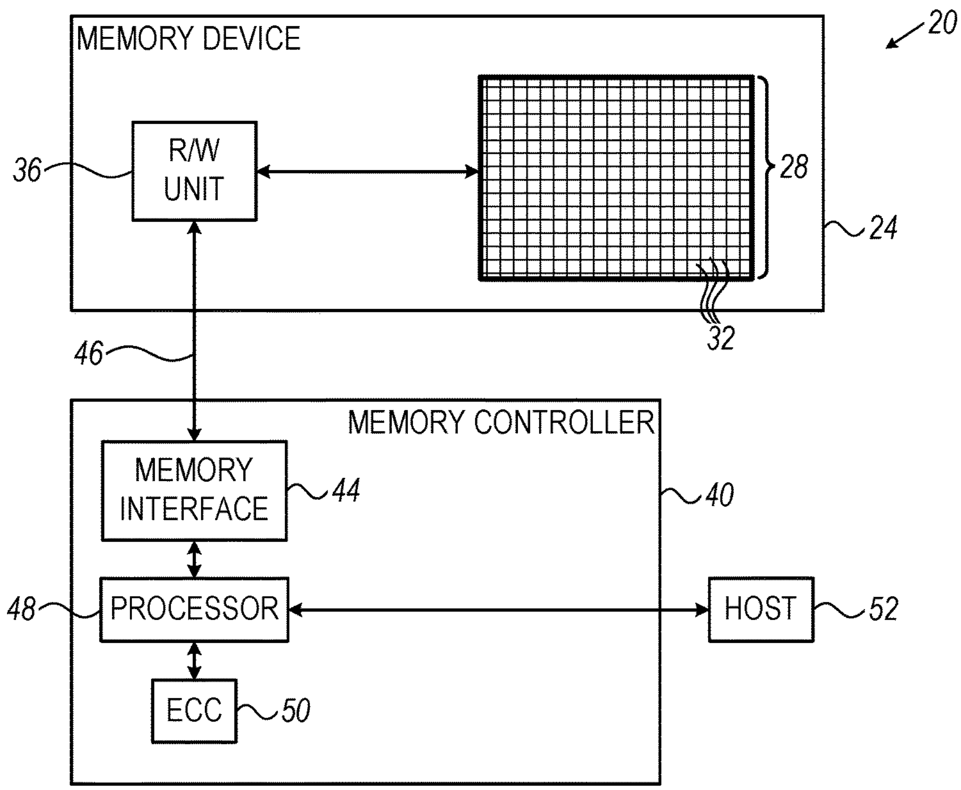
FIG. 1 is a block diagram that schematically illustrates a memory system, in accordance with an embodiment that is described herein.

The performance of non-volatile memory cells typically degrades over time. Embodiments that are described herein provide improved methods and systems for estimating the performance of non-volatile memory cells based on calculating a syndrome weight.

Reading the memory cells typically involves setting one or more read thresholds. At start of life, the memory cells can be read reliably using a single read threshold, which incurs minimal latency. As the memory cells degrade, however, two or more read thresholds may be required, e.g., for improved ECC decoding using soft information.

In some embodiments, the data retrieved from the memory cells comprises a code word that was encoded using an Error Correction Code (ECC), e.g., an ECC defined by multiple check equations. A syndrome vector corresponding to the code word comprises multiple elements, so that each satisfied (or unsatisfied) check equation of the ECC corresponds to a respective zero (or non-zero) element in the syndrome vector. The syndrome vector is also referred to simply as a "syndrome" for brevity.

The number of non-zero elements in the syndrome vector is referred to as a "syndrome weight." In ECC codes having a sparse parity-check matrix, such as Low-Density Parity-Check (LDPC) codes, the syndrome weight is typically related to the number of errors contained in the code word, assuming that the number of errors in the code word is sufficiently small.

Consider a memory device whose memory cells store a single bit per cell, using two nominal programming levels denoted L0 and L1. The memory device comprises a controller for handling data storage in the memory cells. In the present example, L0 and L1 correspond to respective bit values "1" and "0". Let TR1 and TR2 denote read thresholds, which the controller sets at a lower threshold voltage and at a higher threshold voltage, respectively, relative to an optimal read threshold position between L0 and L1. Sensing the memory cells using each of TR1 and TR2 separately results in respective readouts denoted READOUT1 and READOUT2.

The read thresholds TR1 and TR2 divide the threshold voltage axis into three zones, i.e., a lower zone "Z0" below TR1, a middle zone "ZM" between TR1 and TR2, and an upper zone "Z1" above TR2. Conditional probabilities of the form P(Zone/L0) and P(Zone/L1) can be used in modeling the readout process as a communication channel having a channel matrix that is indicative of the readout performance. For a symmetric channel, the channel matrix is characterized by conditional probabilities P0 and P1 given by P0=P(ZM/L0)=P(ZM/L1) and P1=P(Z0/L1)=P(Z1/L0).

In some embodiments, the controller calculates a syndrome weight based only on READOUT1 (or only on READOUT2). It can be shown that because TR1 is positioned non-optimally, the syndrome weight can be expressed as a function f(·) of (P1+P0/2), i.e., a function of a linear combination of P0 and P1. Note that for estimating the channel matrix, the controller should estimate P0 and P1 individually.

In an embodiment, the controller estimates P0 by counting the number of occurrences in which READOUT1 differs from READOUT2. By using the calculated syndrome weight, the estimated P0, and the function f(·), the controller can estimate also the probability P1. The controller then uses the estimated probabilities P0 and P1 in evaluating the channel matrix. The controller may apply similar methods for estimating the channel matrix assuming a non-symmetric channel. In addition, the described techniques are extendable to memory devices that store more than two bits per cell.

In some embodiments, the controller uses the evaluated readout performance for selecting an ECC configuration, e.g., selecting between soft decoding and hard decoding of the ECC. Alternatively or additionally, the controller uses the evaluated readout performance for determining the number of read thresholds and their positions, to be used in subsequent read operations. In applying ECC soft decoding, the controller can use the channel matrix for deriving soft information such as Log Likelihood Ratio values (LLRs) used by the ECC decoder.

By using the disclosed techniques, individual conditional probabilities of the channel matrix can be estimated, based on the syndrome weight, even though the syndrome weight is a function of a linear combination of these probabilities. Various metrics that are indicative of the channel quality can be derived from the channel matrix, such as, Signal to Noise Ratio (SNR) and mutual information.

Moreover, since the disclosed techniques provide improved accuracy in evaluating the performance of the memory cells, managing resources such as soft and hard decoding during the device's lifetime improves. As a result, power consumption and latency are reduced, and the lifetime of the device increases. In addition, when the controller finds that reliable reading is possible using a single read threshold, the throughput also improves.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a memory device 24, which stores data in a memory array 28 that comprises multiple memory cells 32, such as analog memory cells. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), can be programmed to assume one of eight possible programming levels. A memory cell that stores a single bit (i.e., using two programming levels) is also referred to as a Single-Level Cell (SLC).

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of memory array 28, R/W unit 36 converts the storage values of memory cells 32 into digital samples having an integer resolution of one or more bits. Data is typically written to and read from the memory cells in data units that are referred to as data pages (or simply pages, for brevity).

For reading a data page, the R/W unit typically sets one or more read thresholds, e.g., at about mid-points between adjacent nominal programming levels, and senses the threshold voltages of the memory cells relative to the read thresholds. The R/W unit can also read the analog values of the memory cells in selected ranges or zones by setting the read thresholds to zone boundaries.

The storage and retrieval of data in and out of memory device 24 is performed by a memory controller 40. Memory controller 40 comprises a memory interface 44 for communicating with memory device 24, a processor 48, and an Error Correcting Code (ECC) unit 50. The memory controller communicates with the memory device via memory interface 44 over a communication link 46. Communication ink 46 may comprise any suitable link or communication bus, such as, for example, a PCIe bus. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. In some embodiments, ECC unit 50 encodes the data for storage using a suitable ECC and decodes the ECC of data retrieved from the memory. ECC unit 50 may comprise any suitable type of ECC, such as, for example, Low Density Parity Check (LDPC), Reed-Solomon (RS) or Bose-Chaudhuri-Hocquenghem (BCH), can be used. Note, however, that embodiments that are described below that rely on calculating a syndrome weight refer mainly to LDPC codes.

Data read from a group of memory cells may contain one or more errors. The number of errors typically increases when the read threshold used for sensing the memory cells is positioned non-optimally. In some applications, the ECC supported by ECC unit 50 can be represented by multiple check equations.

In an embodiment, a syndrome vector that is indicative of the error pattern is generated by multiplying the readout data vector by the parity-check matrix of the ECC, e.g., using a hardware matrix-by-vector multiplier (not shown). Alternatively, other suitable methods for producing the syndrome vector can also be used. The weight of the syndrome vector, i.e., the number of the non-zero elements in the syndrome vector, is indicative of the number of errors in the code word. In an embodiment, the syndrome vector comprises binary elements, and the syndrome weight is calculated by summing the binary elements having a "1" value.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks (also referred to as "memory blocks"). In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit significance value would have 256 data pages per erasure block, and three-bit-per-cell devices would have 384 data pages per block. A typical three-dimensional (3D) device that stores three bits per cell may comprise, for example, 4 sections per block, wherein each section comprises several thousand strings that each comprises 48 layers of cell columns. Such a 3D device has 12 data pages per a physical word line, or 576 data pages per an erasure block. Alternatively, other block sizes and configurations can also be used.

Syndrome-Based Channel Estimation Techniques

Figure 2:
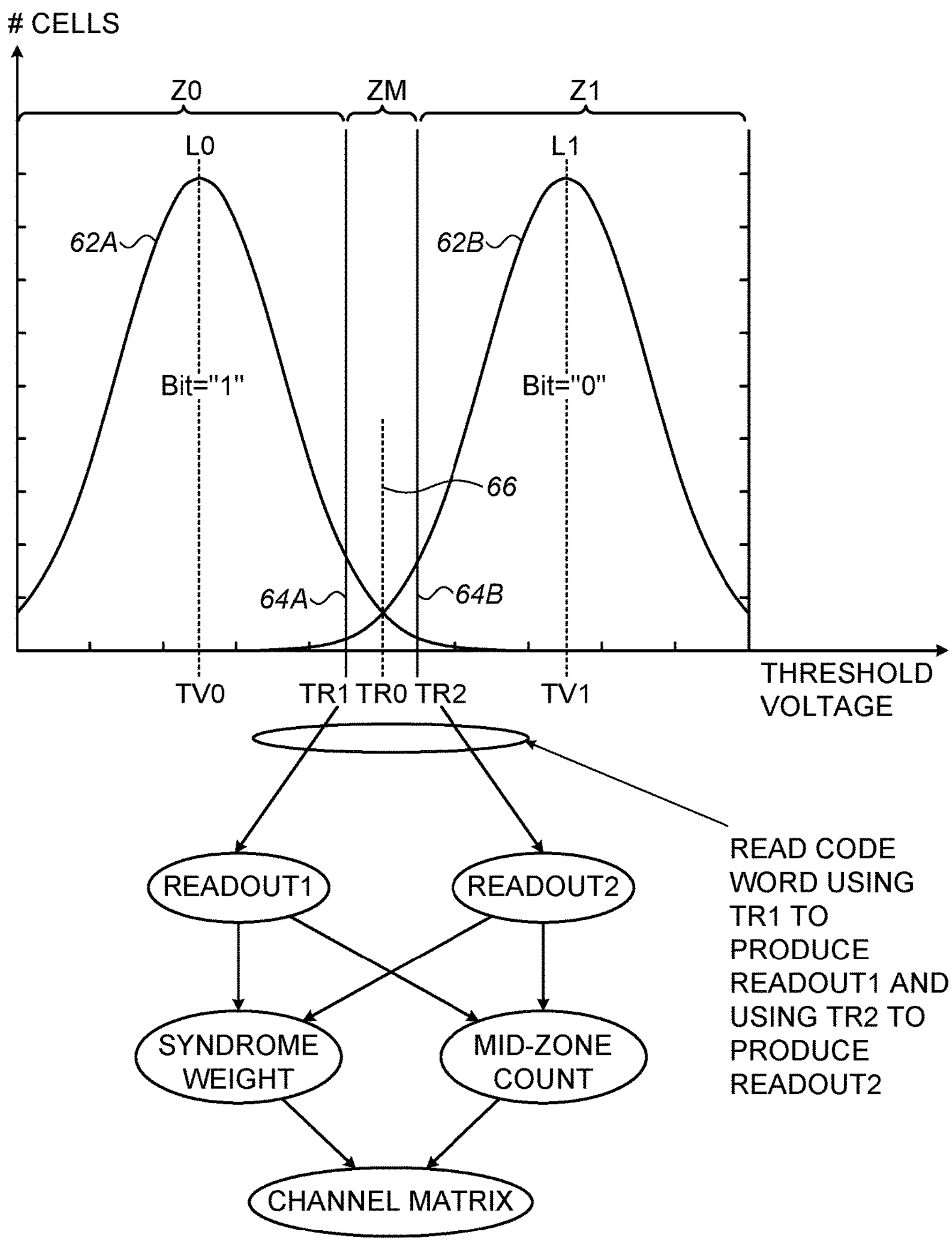
FIG. 2 is a diagram that schematically illustrates threshold voltage distributions in a group of memory cells that are sensed using two read thresholds, and a scheme for channel estimation based on a syndrome weight, in accordance with an embodiment that is described herein.

FIG. 2 is a diagram that schematically illustrates threshold voltage distributions in a group of memory cells 32 that are sensed using two read thresholds, and a scheme for channel estimation based on syndrome weight, in accordance with an embodiment that is described herein.

FIG. 2 depicts two threshold voltage distributions 62A and 62B corresponding to respective programming levels L0 and L1. Threshold voltage distributions 62A and 62B are centered about respective nominal threshold voltages TV0 and TV1. In the present example, threshold the overlapping tails of threshold voltage distributions 62A and 62B behave similarly.

Consider reading data from a group of memory cells by sensing the memory cells using two different read thresholds denoted TR1 (64A) and TR2 (64B). A read threshold TRO (66) represents an optimal read threshold that would have been used in a single-threshold reading operation for achieving minimal probability of error. Because the configuration of threshold voltage distributions 62A and 62B in this example is symmetric, the read thresholds TR1 and TR2 are positioned at equal distances below and above the optimal threshold TRO.

Read thresholds TR1 and TR2 divide the threshold voltage axis into lower, middle and upper zones denoted Z0, ZM and Z1, respectively. Z0 and Z1 correspond to threshold voltages below TR1 and above TR2, respectively. The middle zone ZM corresponds to threshold voltages falling between TR1 and TR2.

Threshold voltages of memory cells that are programmed to programming level L0 (or L1) may fall in each of the three zones. Let P(Z0/L0), P(ZM/L0) and P(Z1/L0) denote the conditional probabilities of the threshold voltages falling in Z0, ZM and Z1, respectively, given that the memory cells were programmed to programming level L0. Similarly, let P(Z0/L1), P(ZM/L1) and P(Z1/L1) denote the conditional probabilities of the threshold voltages falling in Z0, ZM and Z1, respectively, given that the memory cells were programmed to programming level L1.

In some embodiments, the readout performance of the memory cells is characterized by conditional probabilities of the form P(Zone/L0) and P(Zone/L1), wherein "Zone" is one of Z0, ZM and Z1. The conditional probabilities P(Zone/L0) and P(Zone/L1) can be used in modeling a communication channel a two-valued input (i.e., the programming levels L0 and L1) and a three-way output (i.e., Z0, ZM and Z1). A matrix containing these conditional probabilities is referred to as a "channel matrix," and a process for estimating the channel matrix is referred to as "channel estimation." The channel matrix in the present example is given by:

$$\text{Channel Matrix} = \begin{bmatrix} P(Z0/L0) & P(ZM/L0) & P(Z1/L0) \\ P(Z0/L1) & P(ZM/L1) & P(Z1/L1) \end{bmatrix} \quad \text{Equation 1}$$

In Equation 1, the probabilities in each row of the channel matrix sum up to unity.

Assuming a symmetric channel, we define conditional probabilities P1 and P0 as:

$$P1 = P(Z1/L0) = P(Z0/L1) \quad \text{Equation 2:}$$

$$P0 = P(ZM/L0) = P(ZM/L1) \quad \text{Equation 3:}$$

In this case, the channel matrix is given by:

$$\text{Channel Matrix} = \begin{bmatrix} 1-P0-P1 & P0 & P1 \\ P1 & P0 & 1-P0-P1 \end{bmatrix} \quad \text{Equation 4}$$

The channel matrix is typically indicative of the readout performance. Memory cells programmed to L0 (or L1) will typically read correctly when the probability of their threshold voltages falling outsize Z0 (or Z1) is low. Good readout performance is thus characterized, for example, by low valued probabilities P0 and P1.

As noted above, the channel matrix (e.g., given in Equation 1 or Equation 4) may be used for evaluating the readout performance. The lower part of FIG. 2 depicts a scheme for performing channel estimation based on syndrome weight, when the memory cells are sensed using TR1 and TR2. The scheme in FIG. 2 can be executed by processor 48 of memory controller 40, R/W unit 36 of memory device 24, or both. In the present example we assume that the scheme of FIG. 2 is executed by processor 48. Additional embodiments for syndrome weight based channel estimation are described below with reference to FIG. 3.

Consider the processor reading from a group of memory cells a code word that was encoded using an ECC. As described above, a syndrome vector for the code word is a vector whose nonzero elements are associated with respective check equations of the ECC that are unsatisfied for the code word. For an ECC having a sparse parity-check matrix, such as a Low-Density Parity-Check (LDPC) code, the number of nonzero elements in the syndrome vector, also referred to as the "syndrome weight," is indicative of the number of errors contained in the code word. In the description that follows we also refer to the syndrome vector simply as "syndrome" for brevity.

As depicted in FIG. 2, the processor can calculate a syndrome weight based on READOUT1, READOUT2 or both. It can be shown that in the symmetric channel case, a syndrome weight based on READOUT1 alone (or READOUT2 alone) can be expressed as a function f(·) of the probabilities P1 and P0 of Equation 2 and 3, as given by:

$$SW = f\left(\frac{P0}{2} + P1\right) \quad \text{Equation 5}$$

Note that estimating the channel matrix of Equation 4 requires the processor to have explicit knowledge of each of the individual probabilities P0 and P1. In the scheme of FIG. 2, the probability P0 is estimated by generating a MID-ZONE count of the memory cells whose threshold voltages fall between TR1 and TR2. The MID-ZONE count can be evaluated by counting the number of occurrences in which READOUT1 differs from READOUT2. The processor can then estimate P0 by dividing the MID-ZONE count by the length of the code word as given by:

$$\widehat{P0} = \text{(MID-ZONE count)/(code word length)} \quad \text{Equation 6:}$$

Based on the relationship in Equation 5, the calculated syndrome weight and the estimated P0 (or equivalently, the mid-zone count), the processor can estimate the probability P1. For example, assuming that the function f of Equation 5 has a respective inverse function $f^{-1}$, the processor can estimate probability P1 using the expression:

$$\widehat{P1} = f^{-1}(SW) - \frac{\widehat{P0}}{2} \quad \text{Equation 7}$$

Alternatively, given the estimation of P0, the probability P1 can be deduced from Equation 5 using any other suitable method. The processor can then estimate the channel matrix as given in Equation 4, using the estimated probabilities $\widehat{P0}$ and $\widehat{P1}$.

In some embodiments, calculating the syndrome weight is based only on one of READOUT1 and READOUT2, as described above. In other embodiments, the processor calculates syndrome weights SW1 and SW2 for READOUT1 and READOUT2, respectively. In this case, the expression (P0/2+P1) can be estimated more accurately using the syndrome weights of both READOUT1 and READOUT2.

A channel matrix corresponding to a non-symmetric channel, as in Equation 1, is given in Table 1:

TABLE 1

Channel matrix for a non-symmetric channel

| Programming | Zone | | |
|---|---|---|---|
| Level | Z0 | ZM | Z1 |
| L0 | 1-P0_L-P1_L | P0_L | P1_L |
| L1 | P1_U | P0_U | 1-P0_U-P1_U |

In this case, lower and upper syndrome weights SWL and SWU are expressed as respective lower and upper functions fL(·) and fU(·) of the probabilities:

$$SWL = fL[(P0\_L + P1\_L + P1\_U)/2] \quad \text{Equation 8:}$$

$$SWU = fU[(P0\_U + P1\_L + P1\_U)/2]$$

and the MID-ZONE count is given by $$\text{MID-ZONE Count} = (P0\_L + P0\_U) \quad \text{Equation 9:}$$

Using Equations 8 and 9, the processor estimates individual probabilities P0_L and P0_U. In this case, the individual probabilities P1_L and P1_U can be estimated approximately as P1_L=P1_U=(P1_L+P1_U)/2. Alternatively, the processor estimates only the sum (P1_L+P1_U), in which case the full channel matrix will not be calculated.

Figure 3:
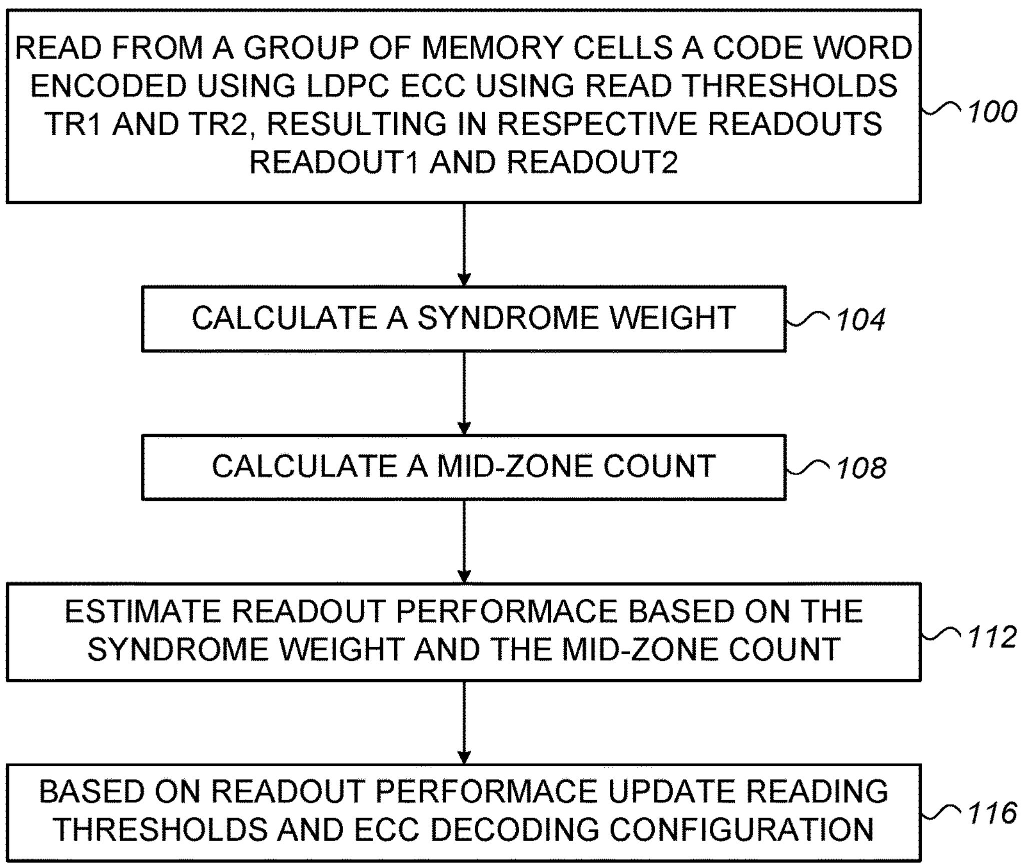
FIG. 3 is a flow chart that schematically illustrates a method for channel estimation based on syndrome weight, in accordance with an embodiment that is described herein.

FIG. 3 is a flow chart that schematically illustrates a method for channel estimation based on syndrome weight, in accordance with an embodiment that is described herein. The method may be executed by R/W unit 36 of memory device 24, memory controller 40 or both. In the description that follows the method is executed by processor 48 of the memory controller in FIG. 1.

We assume that prior to executing the method of FIG. 3, the processor has executed an acquisition process to determine the optimal read threshold TRO.

The method begins at a reading step 100, with processor 48 reading from a group of memory cells 32 a data word that was encoded using a LDPC ECC. For example, the processor reads the code word by sending to memory device 24 one or more read commands to retrieve from array 28 a data page containing the code word.

In the present example, we assume that memory device comprises a SLC device. In some embodiments, the memory device issues two separate sense operations to read the code word using respective read thresholds TR1 and TR2 depicted in FIG. 2, resulting in respective readout outcomes READOUT1 and REAOUT2. In an embodiment, the range of threshold voltages between TR1 and TR2 contains the optimal read threshold TRO.

The processor may consider various factors in positioning the read thresholds TR1 and TR2. For example, when setting TR1 and TR2 at large distances from TRO, the probability P0 can be estimated accurately, but the syndrome weight becomes less informative of the number of errors contained in the code word.

Note that the values of P0 and P1 depend on the positions of the read thresholds TR1 and TR2. For a given setting of these read thresholds, the memory controller estimates the channel matrix by estimating P0 and P1.

At a syndrome weight calculation step 104, the processor calculates a syndrome weight corresponding to the code word, based on only one of the readouts READOUT1 and READOUT2. In some embodiments, the processor determines REODOUT1 as hard bits "1" or "0" when sensing threshold voltages below or above TR1, respectively. Similarly, the processor determines REODOUT2 as hard bits "1" or "0" when sensing threshold voltages below or above TR2, respectively.

In some embodiments, the processor assigns soft metrics to the readouts, e.g., to be used for decoding the ECC using a soft decoder. For example, the processor may assign to the readouts Log Likelihood Ratio (LLR) values according to the zones Z0, ZM and Z1 defined by the read thresholds TR1 and TR2, as described above. The LLR has a sign value that serves as a hard decision or bit value, and a magnitude value that assigns to the hard bit a respective reliability level.

In the present example, e.g., for the sake of soft decoding, the processor assigns to Z0, Z1 and ZM positive, negative and zero LLR values, respectively. Assigning the LLRs can be carried out using a predefined table. The table is addressed by a two-bit input comprising a hard bit from READOUT1 and a hard bit from READOUT2. For example, a bit-pair "11" corresponds to a negative valued LLR and a bit-pair "00" corresponds to a positive valued LLR. Additionally, pair bit values "10" and "01" correspond to zero valued LLR.

In an embodiment, to calculate the syndrome weight based on TR1 (REAOUT1), the processor assigns LLRs with a positive sign to zone ZM. Alternatively or additionally, the processor may calculate a syndrome weight based on TR2 (REAOUT2) by assigning LLRs with a negative sign to ZM.

The processor calculates a syndrome, for example, by multiplying a vector of hard bits (or LLR signs) by a parity-check matrix of the ECC. Then, the processor calculates the syndrome weight by counting the number of non-zero elements in the syndrome.

At a middle zone count calculation step 108, the processor calculates a MID-ZONE count by counting the number of occurrences in which READOUT1 or READOUT2 fall between TR1 and TR2. In an embodiment, the processor evaluates the MID-ZONE count by counting the number of occurrences in which READOUT1 differs from READOUT2.

In some embodiments, a common hardware circuit (e.g., in the memory device) is used for calculating both the syndrome weight at step 104, and the MID-ZONE count at step 108, thus saving die area and power consumption.

At a channel estimation step 112, the processor uses the syndrome weight of step 104 and MID-ZONE count of step 108 to estimate the probabilities P0 and P1, e.g., using Equations 6 and 7 above.

In LDPC codes, the syndrome weight is approximately proportional to (P1+P0/2). For example, when each variable appears in a number K of check equations of the ECC, and P1 can be estimated using an explicit expression to be used in Equation 5, given as:

$$\text{Syndrome Weight} = K \cdot \left(P1 + \frac{P0}{2}\right) \qquad \text{Equation 10}$$

The processor then uses the estimated probabilities P0 and P1 in defining the channel matrix of equation 4 above. Alternatively, the processor applies a method known as Gallagher's formula for getting a more accurate estimation of P1+P0/2. The Gallagher's formula relates between the Bit Error Rate (BER) and the syndrome weight.

At a configuration updating step 116, the processor uses the estimated channel matrix of step 112 for updating the read thresholds configuration, the ECC decoding configuration and/or the calculation of the soft information (e.g., LLRs). In some embodiments, the processor evaluates from the channel matrix a readout performance metric, such as, for example, Signal to Noise Ratio (SNR) or mutual information. Based on the channel matrix of on a performance metric derived from the channel metric, the processor changes the read thresholds configuration, the ECC configuration, or both.

The SNR metric is related to the probabilities P0 and P1 (of Equations 5 and 6 above). Lower SNR values typically correspond to wider threshold voltage distributions, i.e., degraded readout performance, and vice versa. The mutual information metric is indicative of the reliability of the communication channel. Typically, low-valued mutual information corresponds to low-reliability readout performance, and vice versa.

When the processor detects that the readout performance has degraded below a predefined performance level, the processor may decide to set one or more read thresholds in addition to TR1 and TR2. For example, the processor may set an additional read threshold TR3 at the position of TRO. Alternatively, the processor may add two or more read thresholds in the vicinity of TR1 and TR2. Further alternatively or additionally, based on the channel matrix and/or the performance metric derived therefrom, the processor may adjust the positions of TR1, TR2 or both.

In an embodiment, the processor may detect that the readout performance is sufficiently high, and update the read thresholds configuration to use only a single read threshold, e.g., positioned at TRO.

When the processor configures three read thresholds, e.g., TR1, TR2 and TR3=TRO, the middle zone ZM is split to a lower mid-part ZML between TR1 and TRO and an upper mid-part ZMU between TRO and TR2 (not shown). In this case the channel matrix is defined over four zones. In this configuration, the processor performs a separate sensing operation for each of TR1, TRO and TR2, resulting in three respective readout results. The processor estimates the channel matrix by calculating one or more syndromes (e.g., for each of TR1, TRO and TR2), and calculating three zone counts. Note that the three read thresholds divide the threshold voltage axis into four zones, but only three zone counts are required (because the fourth zone count can be derived out of the total count and the three zone counts). Based on the one or more syndromes and the zone counts, the processor can estimate the channel matrix as described herein. In some embodiments, the processor estimates the channel matrix by utilizing the prior distribution of the transmitted symbols, or by applying techniques for solving an underdetermined system of equations, e.g., by choosing a solution for the system that minimized a weighted sum of the distance between the estimated prior distribution and its expected value (usually uniform) and the distance between the observed histogram and the estimated histogram. (The histograms are defined by the various zone counts). The processor may apply similar techniques for estimating the channel matrix when sensing the memory cells using more than three read thresholds.

In the general case of SLC sampling (i.e., two threshold voltage distributions) and dividing the threshold voltage axis into N zones, there are 2N−2 unknown variables in the channel matrix. We can derive N−1 equations from the syndromes, and N−1 equations from the zone counts. So the total number of equations is 2N−2. Assuming that the a-priori transmission probabilities of the symbols ("1" and "0") are available, the memory controller has sufficient information to determine all unknowns and estimate the full channel matrix. Otherwise, we have an underdetermined system of equations.

In some embodiments, based on the evaluated readout performance, the processor selects to decode the code word using a hard decoder or a soft decoder. Soft decoding is typically superior over hard decoding (i.e., handles a larger number of errors in the code word), but is more complex and incurs longer latencies. Alternatively or additionally, the processor may select for subsequent storage operations (write and read operations) an ECC having suitable error correction capabilities. For example, when the readout performance degrades below a predefined level, the processor may apply a stronger ECC, e.g., an ECC having a large redundancy part.

Syndrome Weight Based Channel Estimation in Memory Devices that Store More than One Bit Per Cell The embodiments described above refer mainly to SLC memory devices, but are applicable also to memory devices that store more than one bit per memory cell, such as MLC and TLC devices, as will be described below. The embodiments for the MLC case that will be described below may be executed by processor 48 of memory controller 40, R/W unit 36 of memory device 24 or both. The embodiments below are described as being executed by processor 48.

Consider, for example, a 2 bit/cell MLC device having four programming levels {L0, L1, L2, L3} representing respective bit-pairs {"11," "10," "00," "01"}. In each bit-pair, the left and right bits correspond to a Least Significant Bit (LSB) and a Most Significant Bit (MSB), respectively.

In a 2 bit/cell device of this sort, reading a LSB data page requires differentiating between {L0, L1} and {L2, L3}. In this case, processor 48 sets two read thresholds denoted TR1' and TR2' to define a middle zone ZM' at the area in which the threshold voltage distributions of programming levels L1 and L2 overlap. In addition, the processor sets a lower zone Z0' that includes the threshold voltages below TR1' and an upper zone Z1' that includes the threshold voltages above TR2'. The embodiments described above apply directly using Z0', ZM' and Z1' instead of Z0, ZM and Z1 above.

In reading a MSB data page, the outer programming levels L0 and L3 correspond to a bit value "1," and the inner programming levels L1 and L2 correspond to a bit value "0." Assume that the processor positions read threshold TR1 and TR2 to differentiate between L0 and L1 and further positions read thresholds TR3 and TR4 for differentiating between L2 and L3. Table 2 summarizes the relevant zones of threshold voltages in this case.

TABLE 2

Zones for reading a MSB data page

| | Zone | | |
|---|---|---|---|
| | Z0' ("1") | Z1' ("0") | ZM' |
| Range of threshold voltages (TV) | {TV < TR1} {TV > TR4} | TR2 < TV < TV3 | {TR1 < TV < TR2} {TR3 < TV < TR4} |

Note that ZM' refers to ranges of the threshold voltages in which the reading is considered unreliable, whereas Z0' and Z1' refer to ranges of the threshold voltages in which the reading of "1" and "0" bits are considered relatively reliable.

In an embodiment, using the merged zones of Table 2, the processor estimates a channel matrix using embodiments similar to those described above for the SLC case.

The embodiments described above are given by way of example, and alternative suitable embodiments can also be used. For example, although the embodiments described above refer mainly to SLC and 2 bit/cell MLC devices, the disclosed techniques apply similarly to memory devices that store more than two bits per cell. In case of MLC sampling (e.g., reading a MSB page of a MLC device) using N zones, the number of equations may be smaller than the number of unknown variables, compared to the SLC case. In some embodiments, the memory controller may apply general methods for solving the underdetermined set of equations. One specific method to resolve this issue is to assume that the underlying channel is symmetric.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory system, comprising:

an interface, configured to communicate with a plurality of memory cells that store data by setting the memory cells to analog voltages representative of respective storage values; and storage circuitry including a processor, configured to:

read from a group of the memory cells a code word that was encoded using an Error Correction Code (ECC), by sensing the memory cells in the group using at least first and second read thresholds for producing respective first and second readouts; and based on at least one of the first readout and the second readout, the processor is configured to determine for the code word (i) a syndrome weight that is indicative of an actual number of errors contained in the code word, and (ii) a mid-zone count of the memory cells for which the first readout differs from the second readout, wherein the processor is further configured to evaluate a performance measure for the memory cells in the group, based on the determined syndrome weight and on the mid-zone count, by estimating a channel matrix that is indicative of a readout performance of the memory cells in the group.

2. The memory system according to claim 1, wherein the storage circuitry processor is configured to determine the syndrome weight based only on one of the first readout and the second readout.

3. The memory system according to claim 1, wherein the storage circuitry processor is configured to assign respective soft metric values to elements of the first readout, based on the first readout and on the second readout, wherein each soft metric value comprises a sign and a magnitude, and to determine the syndrome weight based on signs of the soft metrics that were assigned to the elements of the first readout.

4. The memory system according to claim 1, wherein the storage circuitry processor is configured to produce a syndrome vector by multiplying the first readout by a parity-check matrix representing the ECC, and to calculate the syndrome weight by counting a number of nonzero elements in the syndrome vector.

5. The memory system according to claim 1, wherein the syndrome weight is a function of a linear combination of the mid-zone count and a conditional probability of the channel matrix, and wherein the storage circuitry processor is configured to estimate the channel matrix by estimating the conditional probability, based on the function and on the calculated syndrome weight and on the mid-zone count.

6. The memory system according to claim 1, wherein the storage circuitry is configured to select between hard and soft ECC decoding, based on the evaluated performance measure.

7. The memory system according to claim 1, wherein the storage circuitry is configured to determine a number of read thresholds to use in subsequent read operations based on the evaluated performance measure.

8. The memory system according to claim 1, wherein the memory cells in the group are configured to store multiple bits per cell, in a set of multiple programming levels predefined within a range of threshold voltages, wherein the storage circuitry is configured to:

sense the memory cells using multiple read thresholds, including the first and second read thresholds, and produce multiple respective readouts, including the first and second readouts, wherein the multiple read thresholds divide the range of threshold voltages into multiple zones;

identify among the multiple zones two or more middle zones corresponding to mid-ranges between respective programming levels;

calculate, by the storage circuitry processor, a syndrome weight based on one of the multiple readouts; and evaluate, by the storage circuitry processor, the performance measure based on the syndrome weight that was calculated based on one of the multiple readouts, and on a number of memory cells for which the readouts fall in the middle zones.

9. A method, comprising:

in a memory system comprising a plurality of memory cells that store data by setting the memory cells to analog voltages representative of respective storage values, reading from a group of the memory cells a code word that was encoded using an Error Correction Code (ECC), by sensing the memory cells in the group using at least first and second read thresholds for producing respective first and second readouts;

based on at least one of the first readout and the second readout, calculating, by a processor of the memory system, for the code word (i) a syndrome weight that estimates an actual number of errors contained in the code word, and (ii) a mid-zone count of the memory cells for which the first readout differs from the second readout; and evaluating, by the processor, a performance measure for the memory cells in the group, based on the calculated syndrome weight and on the mid-zone count, by estimating a channel matrix that is indicative of a readout performance of the memory cells in the group.

10. The method according to claim 9, wherein calculating the syndrome weight comprises calculating the syndrome weight based only on one of the first readout and the second readout.

11. The method according to claim 9, wherein calculating the syndrome weight comprises assigning respective soft metric values to elements of the first readout, based on the first readout and on the second readout, wherein each soft metric value comprises a sign and a magnitude, and calculating the syndrome weight based on signs of the soft metrics that were assigned to the elements of the first readout.

12. The method according to claim 9, wherein calculating the syndrome weight comprises producing a syndrome vector by multiplying the first readout by a parity-check matrix representing the ECC, and counting a number of nonzero elements in the syndrome vector.

13. The method according to claim 9, wherein the syndrome weight is a function of a linear combination of the mid-zone count and a conditional probability of the channel matrix, and wherein estimating the channel matrix comprises estimating the conditional probability, based on the function and on the calculated syndrome weight and on the mid-zone count.

14. The method according to claim 9, and comprising selecting between hard and soft ECC decoding, based on the evaluated performance measure.

15. The method according to claim 9, and comprising determining a number of read thresholds to use in subsequent read operations based on the evaluated performance measure.

16. The method according to claim 9, wherein the memory cells in the group store multiple bits per cell, in a set of multiple programming levels predefined within a range of threshold voltages, wherein sensing the memory cells comprises sensing the memory cells using multiple read thresholds, including the first and second read thresholds, to produce multiple respective readouts, including the first and second readouts, wherein the multiple read thresholds divide the range of threshold voltages into multiple zones, the method further comprises identifying among the multiple zones two or more middle zones corresponding to mid-ranges between respective programming levels, wherein calculating the syndrome weight comprises calculating the syndrome weight based on one of the multiple readouts, and wherein evaluating the performance measure comprises evaluating the performance measure based on the syndrome weight that was calculated based on one of the multiple readouts, and on a number of memory cells for which the readouts fall in the middle zones.

* * * * *